(12) United States Patent
Lee et al.

(10) Patent No.: US 7,081,769 B2
(45) Date of Patent: Jul. 25, 2006

(54) METHOD OF IDENTIFYING AND ANALYZING SEMICONDUCTOR CHIP DEFECTS

(75) Inventors: Sang-Eun Lee, Gyeonggi-do (KR); Jae-Sung Han, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 71 days.

(21) Appl. No.: 10/068,152

(22) Filed: Feb. 6, 2002

(65) Prior Publication Data

US 2002/0153916 A1 Oct. 24, 2002

(30) Foreign Application Priority Data

Feb. 20, 2001 (KR) .......................................... 2001-8465

(51) Int. Cl.
*G01R 31/26* (2006.01)
*G01R 31/02* (2006.01)

(52) U.S. Cl. ........................................ 324/765; 324/754
(58) Field of Classification Search ................ 324/750, 324/754, 760, 765; 438/14–18; 382/141, 382/145, 147, 149; 250/307–310, 559, 559.3, 250/559.43, 559.44, 559.45
See application file for complete search history.

(56) References Cited

U.S. PATENT DOCUMENTS

| | | | | |
|---|---|---|---|---|
| 5,256,578 A | * | 10/1993 | Corley et al. ................. 438/17 |
| 5,659,172 A | * | 8/1997 | Wagner et al. .............. 382/145 |
| 5,761,064 A | * | 6/1998 | La et al. ........................ 702/35 |
| 5,838,951 A | * | 11/1998 | Song ........................... 324/754 |
| 5,985,497 A | * | 11/1999 | Phan et al. .................. 382/149 |
| 6,016,562 A | * | 1/2000 | Miyazaki et al. ........... 714/724 |
| 6,051,845 A | * | 4/2000 | Uritsky .................... 250/559.3 |
| 6,122,562 A | * | 9/2000 | Kinney et al. .............. 700/121 |
| 6,246,787 B1 | * | 6/2001 | Hennessey et al. ......... 382/141 |
| 6,252,412 B1 | * | 6/2001 | Talbot et al. ................ 324/750 |
| 6,265,232 B1 | * | 7/2001 | Simmons ...................... 438/14 |
| 6,407,373 B1 | * | 6/2002 | Dotan ..................... 250/201.3 |
| 6,441,897 B1 | * | 8/2002 | Zeimantz .................... 250/310 |
| 6,477,685 B1 | * | 11/2002 | Lovelace ........................ 716/4 |
| 6,524,881 B1 | * | 2/2003 | Tandy et al. ................... 438/69 |
| 6,559,457 B1 | * | 5/2003 | Phan et al. ............... 250/491.1 |
| 6,559,662 B1 | * | 5/2003 | Yamada et al. ............. 324/751 |
| 6,567,168 B1 | * | 5/2003 | Nara et al. .................. 250/310 |
| 2003/0003688 A1 | * | 1/2003 | Tandy et al. ................ 438/459 |

* cited by examiner

*Primary Examiner*—Jermele M. Hollington
(74) *Attorney, Agent, or Firm*—Marger Johnson & McCollom, P.C.

(57) ABSTRACT

According to a preferred aspect of this invention, locations of defects on a semiconductor wafer are found using semiconductor defect inspection instrumentation. Defect composition can also be determined using inspection instrumentation. Wafer defects are represented on a wafer defect map using markings wherein locations of the markings on the map correspond to the locations of the defects on the wafer. The markings also preferably represent a defect type and/or composition. Color-coded dots, for instance, can be used to represent like defect causes or types with like colors. Graphs can be prepared to display defect characteristics using distributions and skews to facilitate quick statistical analysis of the defects. In this manner, wafer defects can be analyzed quickly and efficiently based on characteristics thereof, including, for example, defect type, composition, and cause. This information can be used to help prevent future defects during mass production, thereby improving yield.

10 Claims, 7 Drawing Sheets

METHOD OF IDENTIFYING AND ANALYZING SEMICONDUCTOR CHIP DEFECTS

CROSS REFERENCE

This application claims priority, under 35 U.S.C. § 119, from Korean Patent Application No. 2001-8465, filed on Feb. 20, 2001, the contents of which are incorporated herein by reference in their entirety.

BACKGROUND OF THE INVENTION

1. Field of the Invention

The present invention relates to methods of identifying semiconductor chip defects on a wafer and classifying those defects based on the type of defect. More particularly, this invention relates to using semiconductor inspection instruments to identify, analyze, and display the number and type of chip defects generated in a wafer.

2. Description of the Related Art

In the field of Defect Review Tools (DRTs), several instruments are widely used to identify and analyze chip defects. For example, Scanning Electron Microscopes (SEMs), made by Hitachi or KLA, and a Focused Ion Beam (FIB), made by FEB, are all widely used for this purpose. In addition to the foregoing instruments, which are used to image defect sources for review, the recent technological trend has been toward developing an instrument for identifying the cause of these defects by determining the composition of the defect. Commercial instruments implementing this trend have been introduced in the market. The goal of this trend is to overcome technological limits expected to be encountered in defect reduction in around the year 2003. This trend is expected to accelerate during upcoming decades.

Unfortunately, even though these newly introduced DRT instruments that analyze defects based on composition have already helped obtain cleanness levels of Class 1, problems have been encountered in identifying chip defect causes based on defect composition. In particular, defect data obtained using these instruments is complicated. Anyone other than a highly trained specialist therefore has difficulty understanding the defect data obtained by the DRT instrument. A mass production implementation of these DRT instruments is therefore impractical without better analysis tools.

Defect management in mass production of semiconductor products is critical because defects are directly related to mass production yields. Presently, defects are classified according to size using instruments such as SEMs or an AIT, and are classified according to type using instruments having a review station, such as an INS3000 made by Leica.

Defect classifications using these tools, however, remain in a primitive state and can include numerous operator errors. These errors impede the recent trend toward miniaturization of semiconductor devices. Additional analysis is therefore required before defects can be eliminated. In addition, even though some analysis is typically performed to help eliminate defects, it is difficult to correctly classify and analyze defects according to type using the prior art classification methods.

Furthermore, despite the amount of information obtained, that information alone is not sufficient to determine the cause of individual defects. In other words, even though statistical classification and management of the defects is possible, using the information obtained, the information regarding individual defects is not sufficient to determine the cause of that defect. Additional analysis is therefore necessary to get the desired information relating to individual defects.

FIG. 4A illustrates a wafer defect map and a scanning electron microscope according to the prior art. The wafer defect map 10 of FIG. 4A was obtained using the KLA SEM 15, graphically represented by a rectangular box. FIG. 4B is a bar graph of defects classified by type according to the prior art. The data in FIG. 4B was analyzed in a conventional instrument having a review station using the defect map of FIG. 4A.

In the conventional defect review process, pictures of the defects are generally taken using an optic or scanning electron microscope. Classification of defects by type is accomplished using the microscope pictures. When the defect problem in the wafer production process is serious, the cause of defects may also be analyzed by determining defect composition. However, the data obtained from the conventional component analysis is difficult to understand and requires careful review by a skilled technician.

The defects generated on a chip have a significant influence on the yield loss and on the inferiority of chip characteristics. It should be noted, however, that even when there are a hundred chips containing defects, the yield loss is generated in only between about 1 to 30 of those chips (i.e., about 1–30% of the chips having defects). The yield loss is not generated in the other 70 to 99 chips. In other words, the yield loss of one semiconductor process can be different from the yield loss of another process, even though the same number of chips with defects are generated in those processes. The yield loss may also differ according to the type of semiconductor device, as well as the size, location, and type of defect.

For example, a DRAM device chip cannot be produced when a defect exists in an area surrounding a memory cell. When the defect exists within the memory cell, however, the chip can still be used to produce a good chip. This is because a laser repairing process can be used to repair the chip using redundancy cells in the same chip. Accordingly, in DRAM devices, the yield loss depends more upon the position of the defects than on the number of defects.

Chip defects are not the only cause of yield loss in a semiconductor product. Defects in manufacturing processes, such as a photolithography process, an etching process, a diffusion process, an ion implanting process, and a thin film deposition process, can also result in chip failure. It is therefore often difficult to clearly identify the influence of chip defects on yield loss.

As described above, the degree of yield loss resulting from chip defects varies depending on the type of device being manufactured and the processes used to produce that device. In addition, the conditions in a semiconductor manufacturing plant, such as the equipment, surroundings, and treatments can also cause defects. Managing yield by managing defects is therefore extremely difficult.

Presently, the technology that uses chip defects to measure yield loss and identify inferior chip characteristics can identify a total number of defects on a wafer, a total number of defect chips, and can classify defects according to defect size and type. After matching these measurements with yield results, this data is analyzed in several ways. For example, a total number of chip defects is compared to the degree of yield loss as well as to the number of particular kinds of chip defects. The total number of chips having defects is also compared to the degree of yield loss and the number of particular kinds of defects in the chips.

Accordingly, only relative measurements of the yield loss are determined. The yield loss and the particular defect ratios are increased when the total number of defects and the total number of defect chips are increased. Because subsequent semiconductor processes can vary the yield loss in the produced semiconductor device, it is difficult to precisely determine at this stage how the defects will influence the ultimate yield loss. It is therefore also impractical to measure absolute values of the yield loss by the defects.

Korean Patent Application No. 1998-29089 discloses methods of measuring the number of chips in the yield loss and the number of defective chips, by type, based on the semiconductor chip defects. The method described in that application, however, can only properly manage and correctly measure the number of chips with defects in a unit process or between unit processes. Information for each of the defects is insufficient to enable the desired analysis and a quick response to the chip defects is therefore difficult.

SUMMARY OF THE INVENTION

To overcome the foregoing problems, various preferred embodiments of the present invention provide an improved map of wafer defects, defect cause distribution charts, and a method of analyzing the causes of defects simply and quickly.

In a preferred embodiment of the present invention, a method of identifying and marking chip defects based on the cause of the defect is provided. Defects are first identified using a semiconductor defect inspection instrument. The defect inspection instrument is then used to analyze the composition of the defect to determine a cause thereof. The defects are thereafter marked on a wafer map using the same marks to represent defects caused in the same manner. Using these specially-coded markings, graphs and other charts can then be prepared to display distributions, skews, and other arrangements of defect characteristics. The defects can then be more readily analyzed statistically.

BRIEF DESCRIPTION OF THE DRAWINGS

A more complete understanding of the advantages of the present invention will be available through the following detailed description of preferred embodiments, made with reference to the following drawings, in which.

DETAILED DESCRIPTION OF PREFERRED EMBODIMENTS

Figure 1:
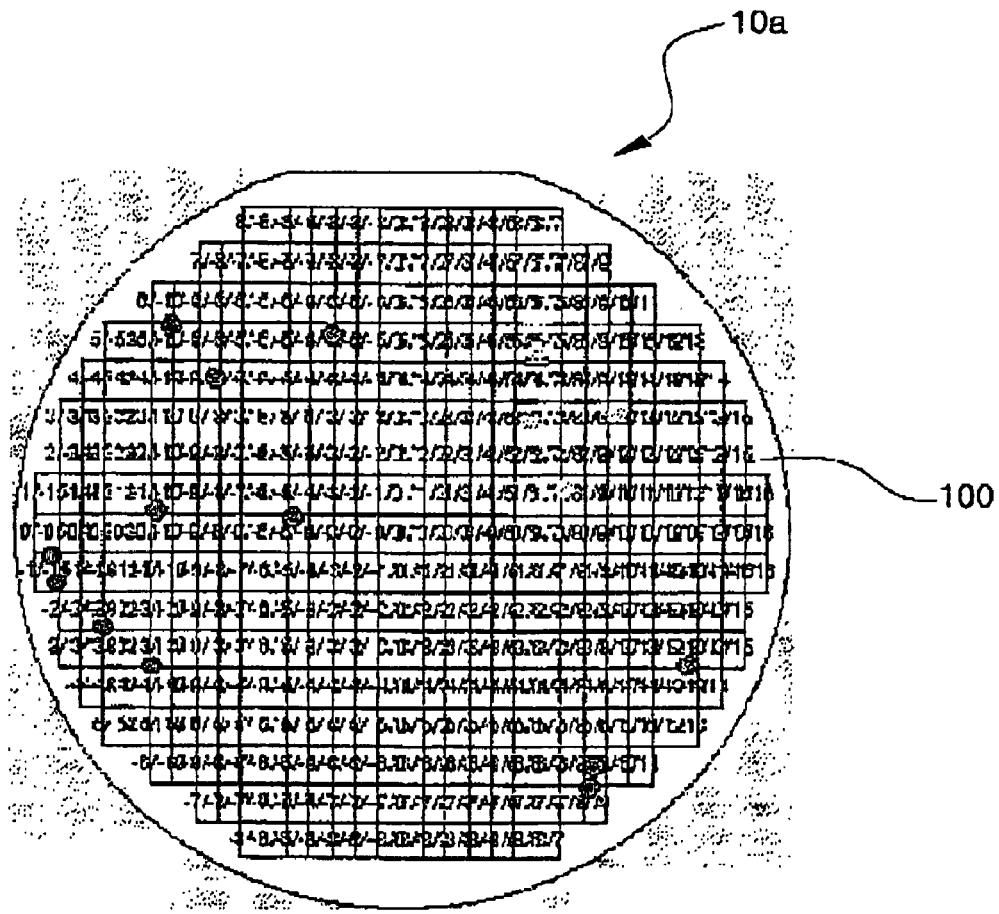
FIG. 1 is a wafer map identifying defect locations on a wafer by type, according to one aspect of the present invention.
Figure 1:
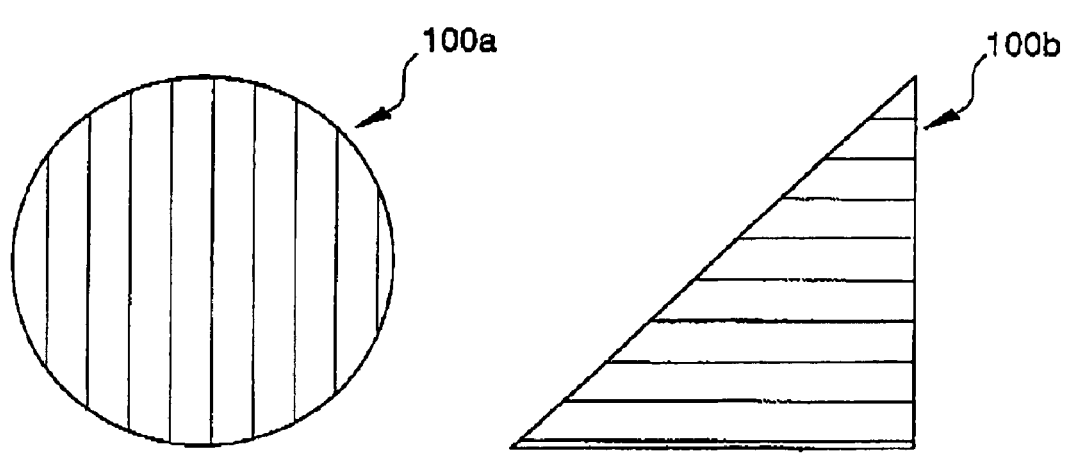
Figure 2:
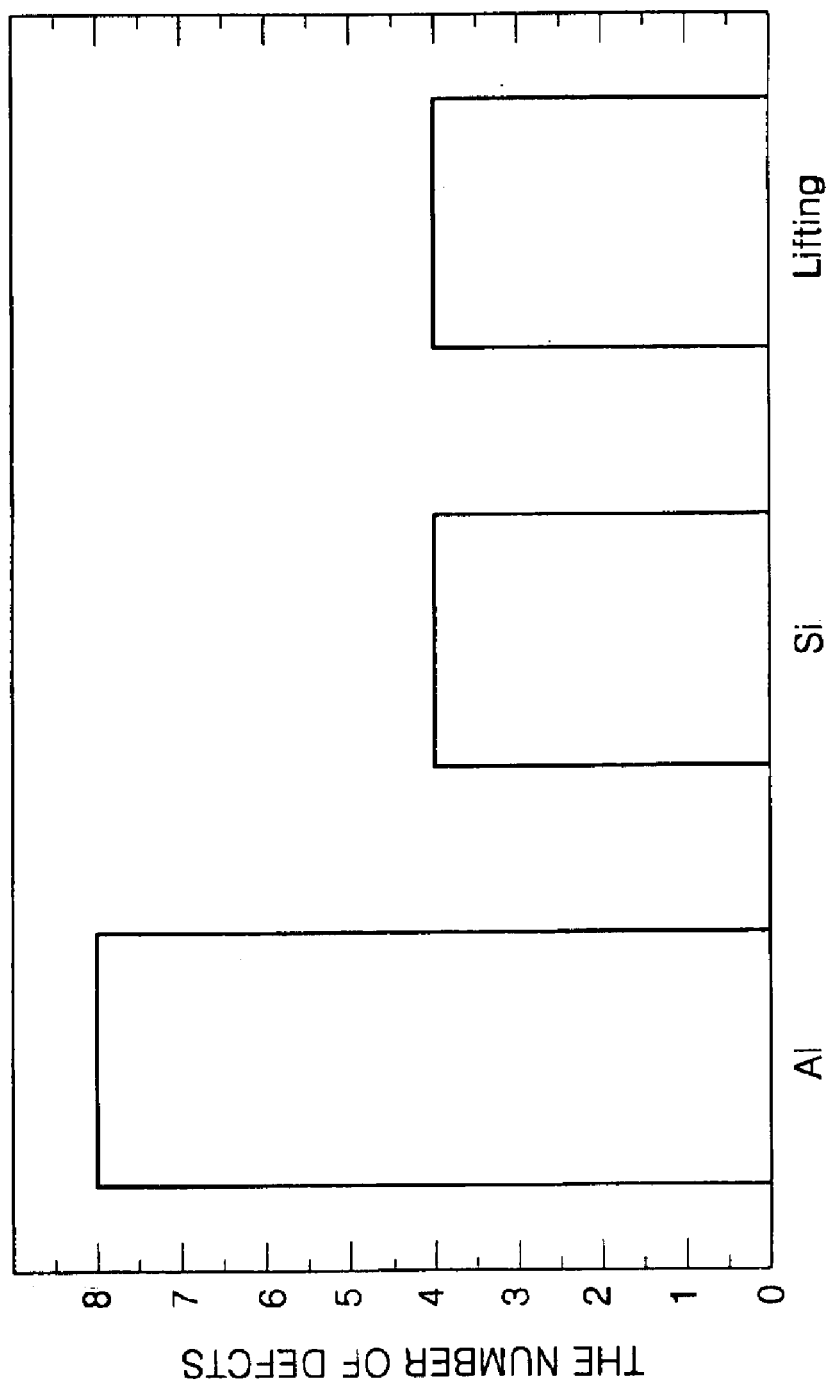
FIG. 2 is a bar graph classifying defects based on causes thereof, according to another aspect of the present invention.

Various preferred embodiments of the present invention will now be described in further detail. Referring to FIG. 1, a wafer defect map 10*a*, according to one aspect of the present invention, identifies the location of defects on the wafer using markings 100. In the wafer defect map of FIG. 1, like markings are used to represent defects of the same type. FIG. 2 is a bar graph illustrating a process of classifying the defects according to another aspect of the present invention.

Referring to FIGS. 1 and 2, a method of identifying and analyzing defects in semiconductor chips, according to a preferred aspect of this invention, will be described. One or more semiconductor defect inspection instruments are first used to identify the location and type of defects on a wafer. A Defect Review Tool (DRT), such as the KLA SEM, can be used for this purpose. After the defects have been located, the same defect inspection instrument, or a different inspection instrument, is used to determine the composition of the defects.

Figure 3A:
FIGS. 3A, 3B, and 3C are printouts of SEM, EDS, and AES results, respectively, for finding defects, identifying the type of defect, and analyzing the composition thereof, according to still another aspect of the present invention.
Figure 3B:
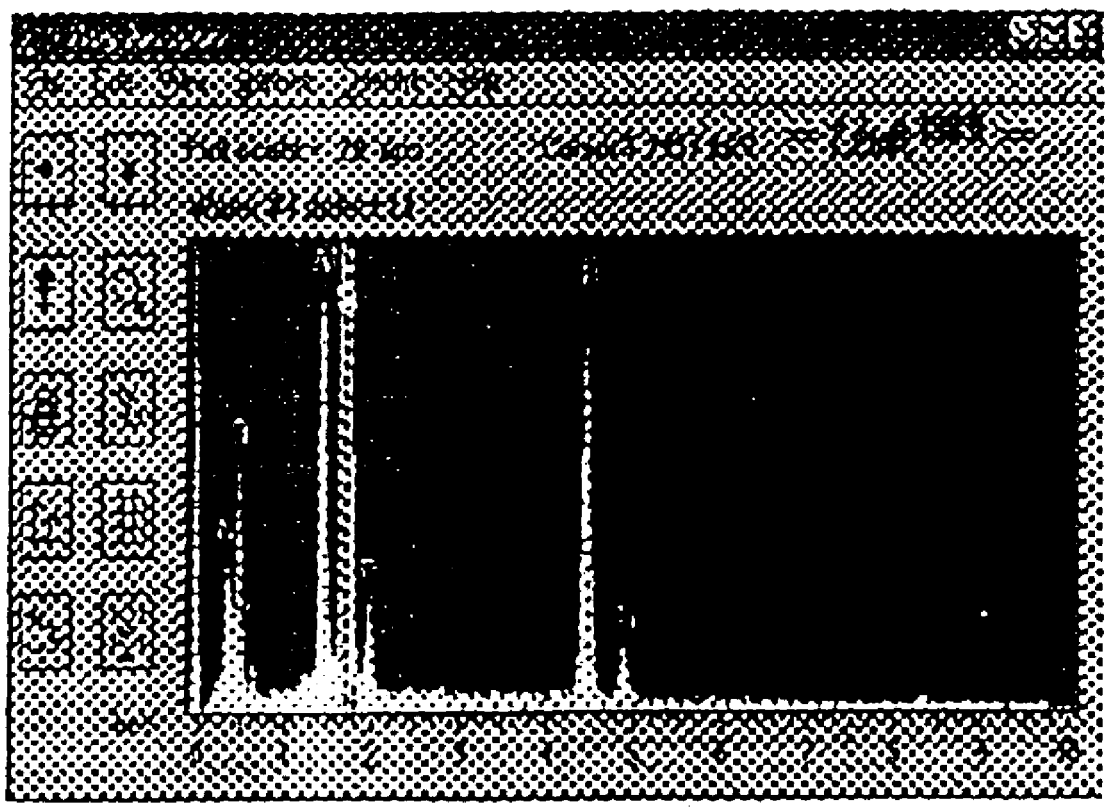
Figure 3C:
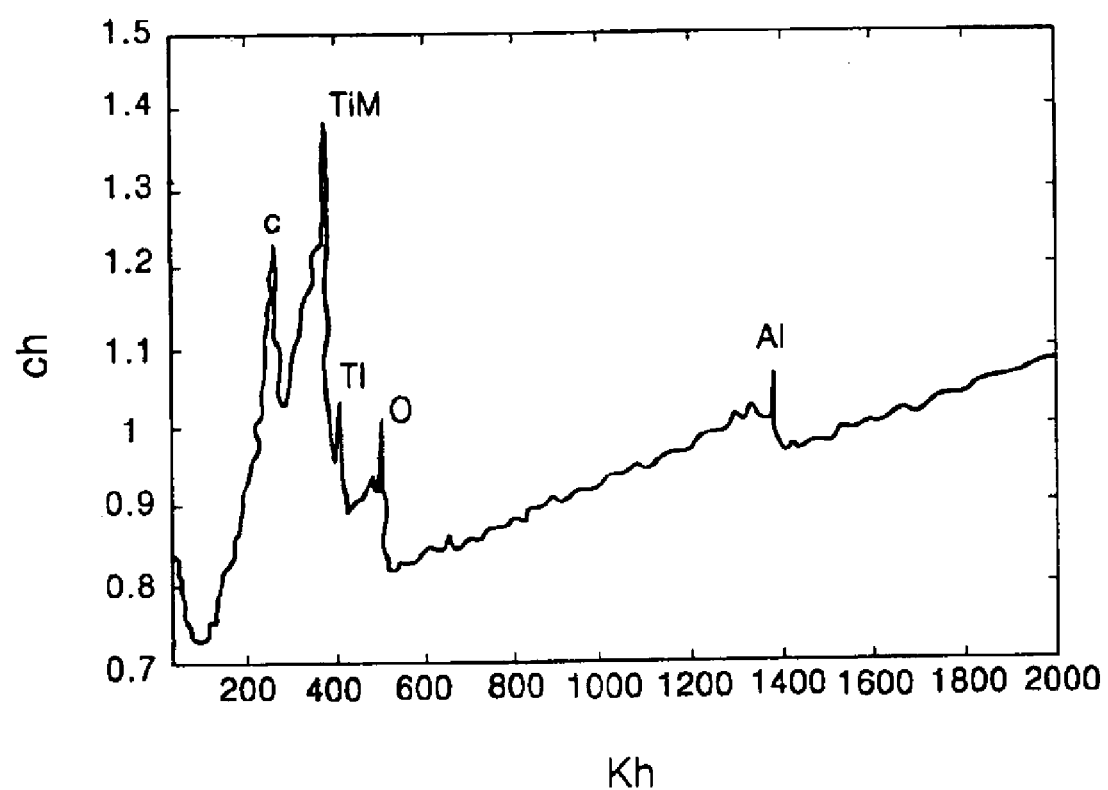
Figure 4A:
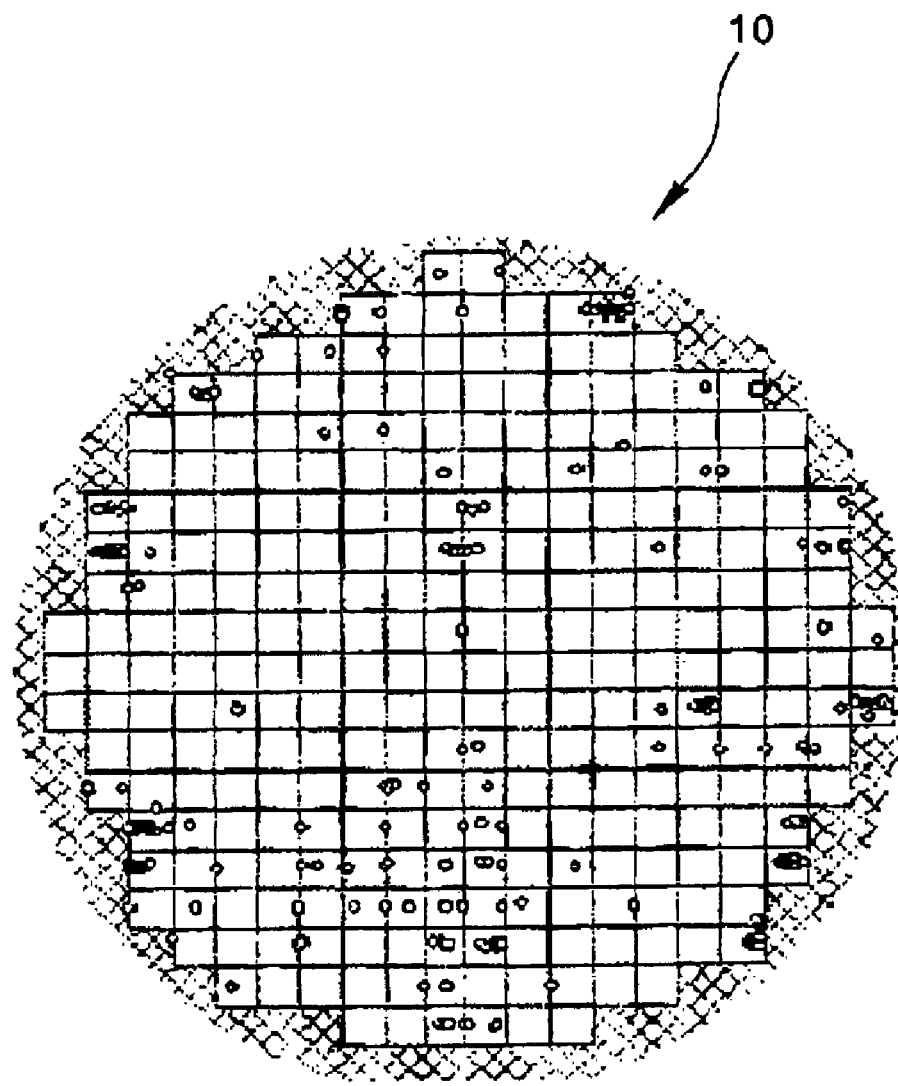
FIG. 4*a* is a wafer defect map according to the prior art.
Figure 4A:
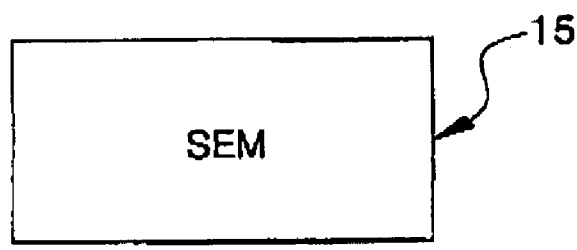
Figure 4B:
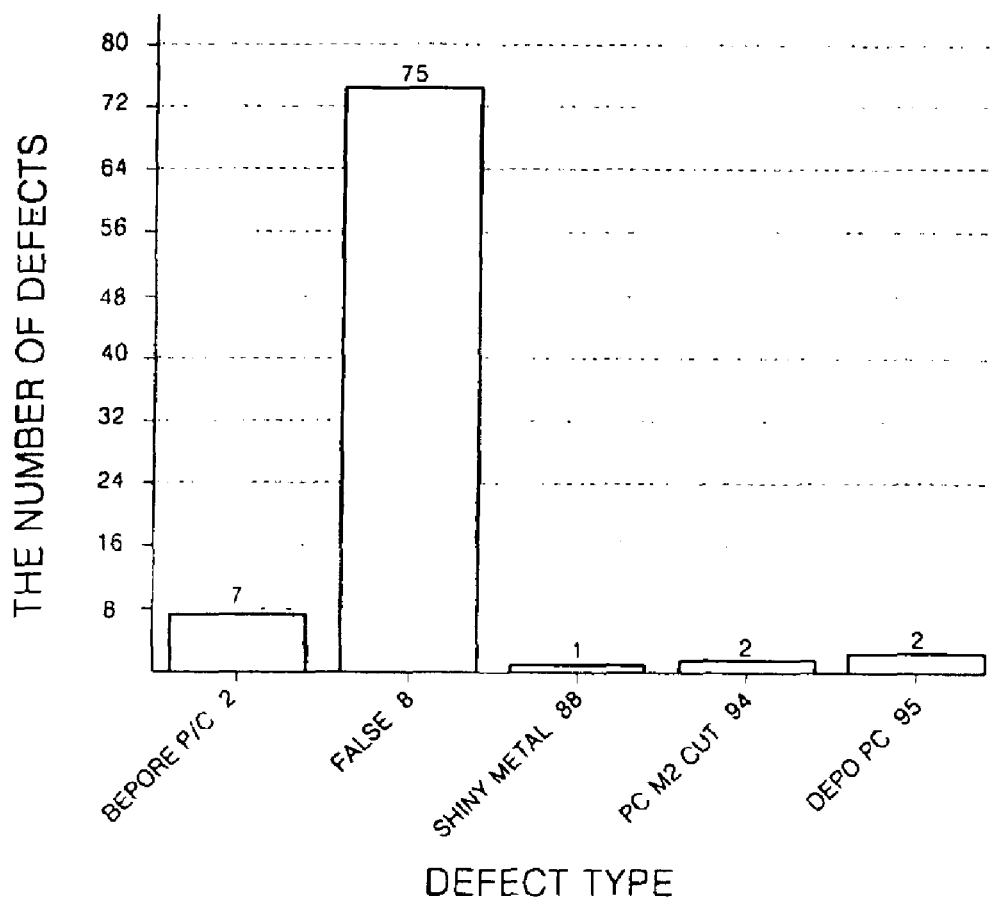
FIG. 4*b* is a bar graph representing the number of defects by defect type, according to the prior art.

Referring to FIGS. 3A through 3C, the defect analysis is preferably performed by first taking a picture of the defect structure using a SEM. A sample SEM picture is shown in FIG. 3A. An EDS analysis can also be conducted on the defect, sample results of which are illustrated in FIG. 3B. An AES analysis can then be used to determine a composition of the defect. The results of the AES analysis on the defect of FIG. 3A are shown in FIG. 3C. A table is then preferably created and identifies the defects by number, and further specifies the type of defects, the process that resulted in the defect, the defect composition, and the position of the defects on the wafer. Table 1, for example, is constructed according to this aspect of the present invention.

TABLE 1

| Defect No. | Classification of defect type using SEM equipment | Classification of process resulting in defect using the semi-conductor inspection equipment | Classification of defect composition using AES equipment | Position of defect on a wafer |
|---|---|---|---|---|
| 12 | 155 | Al defect after TiN deposition | Al metal | Surface |
| 13 | 155 | Al defect after TiN deposition | Al Oxide, F | Surface |
| 15 | 99 | None | | Pit |
| 18 | 99 | None | | Pit |
| 19 | 99 | None | | Pit |
| 21 | 99 | None | | Pit |
| 28 | 155 | Si defect before TiN deposition | | Buried area |
| 29 | 155 | Si defect before TiN deposition | | Buried area |
| 30 | 155 | Si defect before TiN deposition | | Buried area |
| 34 | 155 | Si defect before TiN deposition | Si Metal | Buried area |
| 38 | 155 | Si defect before TiN deposition | Al Oxide | Buried area |
| 39 | 155 | Si defect before TiN deposition | Al Oxide | Surface |
| 42 | 155 | Si defect before TiN deposition | Al Oxide | Surface |
| 45 | 155 | Si defect before TiN deposition | Al Oxide | Surface |

Mark 100*a* and mark 100*b* are just two possible detailed examples of markings 100 that could be used to identify types of defects in the wafer map 10*a*. Mark 100*a* is a dot mark, while mark 100*b* is a triangular mark. The vertical cross-hatching of mark 100*a* and the horizontal cross-hatching of mark 100*b* indicate that the two marks have different colors.

Referring back to FIG. 1, after the defect analysis is completed, a wafer map 10*a* is constructed using markings 100 to show the locations of the defects. The markings 100 are preferably used to identify both defect location and type, with like markings representing the same type of defect. The markings, for instance, can be dot marks, with dot colors assigned depending on defect type or the markings can have different shapes depending on defect type.

After the defects have been marked on the wafer map 10a, an inspection instrument, such as a review station, is used to categorize the defects based on various defect characteristics. The number and type of defects can be represented in a bar graph, such as that shown in FIG. 2 for instance, to facilitate a quick statistical analysis thereof. Bar graphs could also be created concurrently with the marking of defects on the wafer map 10a.

The defects can also be coded and analyzed electronically. In the electronic process, a defect inspection instrument is again preferably used to find the defects. Data corresponding to the defects is then coded and stored in files or in a database. The defect data can then be analyzed using an appropriate software program. Using this method, after existing defects have been identified and tabulated, defects generated in subsequent processes can be easily identified and analyzed in a short period of time.

According to these aspects of the present invention, wafer defects can be identified and statistically analyzed according to information obtained using defect recognition tools. This method can be used to quickly and efficiently identify the generation of defects during the mass production of semiconductor chips, so that the causes of those defects can be identified and prevented, resulting in an improved yield. Although the present invention has been shown and described with reference to preferred embodiments thereof, it will be understood by those skilled in the art that various changes can be made in the form and details thereof without departing from the spirit and scope of the following claims.

What is claimed is:

1. A method comprising:

identifying a defect location and a defect type for each of at least two defects on a semiconductor wafer;

determining a chemical composition of each of the at least two defects;

preparing a wafer defect map to visually represent the defect location and the defect type for each of the at least two defects; and statistically representing the at least two defects with at least one visual aid.

2. The method according to claim 1, further comprising, for each of the at least two defects, placing a marking on the wafer defect map that corresponds to the defect location.

3. The method according to claim 2, wherein placing the marking comprises using the marking that is color-coded based upon the defect type.

4. The method according to claim 1, wherein identifying the defect location and the defect type comprises using an optical or scanning electron microscope.

5. The method according to claim 1, wherein determining the chemical composition comprises performing an AES analysis on each of the at least two defects.

6. The method according to claim 1, wherein statistically representing the at least two defects comprises constructing a table having columns corresponding to the defect type, the chemical composition, a defect cause, and the defect location.

7. The method according to claim 1, wherein statistically representing the at least two defects comprises preparing a bar graph that represents the at least two defects according to the defect type.

8. The method according to claim 1, wherein preparing the wafer defect map and statistically representing the at least two defects is performed electronically.

9. The method according to claim 8, wherein identifying the defect location and the defect type, and determining the chemical composition of each of the at least two defects is also performed electronically.

10. The method according to claim 1, further comprising analyzing the at least one visual aid to determine appropriate corrective action in a wafer fabrication process.

* * * * *